United States Patent [19]

Stephens

[11] Patent Number: 5,386,426
[45] Date of Patent: Jan. 31, 1995

[54] NARROW BANDWIDTH LASER ARRAY SYSTEM

[75] Inventor: Ronald R. Stephens, Westlake Village, Calif.

[73] Assignee: Hughes Aircraft Company, Los Angeles, Calif.

[21] Appl. No.: 943,161

[22] Filed: Sep. 10, 1992

[51] Int. Cl.⁶ .............................................. H01S 3/10
[52] U.S. Cl. ..................................... 372/20; 372/102; 372/101; 372/69; 372/9; 372/75
[58] Field of Search ................... 372/9, 99, 69, 103, 372/102, 75, 20, 101

[56] References Cited

U.S. PATENT DOCUMENTS

| | | | |
|---|---|---|---|
| 4,656,641 | 4/1987 | Scifres et al. | 372/9 |
| 4,913,525 | 4/1990 | Asakura et al. | 372/102 |
| 4,942,583 | 7/1990 | Nazarathy et al. | 372/102 |
| 5,008,890 | 4/1991 | McFarlane . | |
| 5,022,042 | 6/1991 | Bradley | 372/75 |
| 5,027,359 | 6/1991 | Leger et al. . | |
| 5,115,444 | 5/1992 | Kirkby et al. | 372/102 |
| 5,140,599 | 8/1992 | Trutna, Jr. et al. | 372/20 |
| 5,216,680 | 6/1993 | Magnusson et al. | 372/102 |

OTHER PUBLICATIONS

Weiman et al., "Using Diode Lasers for Atomic Physics", Rev. Sci. Instrum., vol. 62, No. 1, Jan. 1991, pp. 1–20.
Patrick et al., "Frequency Stabilization of a Diode Laser Using Simultaneous Optical Feedback From a Diffraction Grating and a Narrow Band Fabry-Perot Cavity", Rev. Sci. Instrum., vol. 62, No. 11, Nov. 1991, pp. 2593–2595.
Epler et al., "Super Modes of Multiple-Stripe Quantum-Well Heterostructure Laser Diodes Operated (CW, 300K) in an External-Grating Cavity", Journal of Applied Physics, vol. 57, No. 5, Mar. 1, 1985, pp. 1489–1494.
Harvey et al., "External-Cavity Diode Laser Using a Grazing-Incidence Diffraction Grating", Optics Letters, vol. 16, No. 12, Jun. 15, 1991, pp. 910–912.
"Single mode high-power diode laser array for optical communication", S. Wang et al., SPIE vol. 1218 Free-Space Laser Communication Technologies 11 (1990), pp. 278–284.
"Operation of five individual diode lasers as a coherent ensemble by fiber coupling into an external cavity", C. J. Corcoran et al., Appl. Phys. Lett. 59 (7), 12 Aug. 1991, pp. 759–761.
"High Power, cw, diffraction-limited, GaAlAs laser diode array in an external Talbot cavity", R. Waarts et al., Appl. Phys. Lett. 58 (1991) 10 Jun., No. 23, New York, pp. 2586–2588.
IBM Technical Disclosure Bulletin, vol. 12, No. 4, Sep. 1969, New York, pp. 580–581.
"Intracavity phase correction of an external Talbot cavity laser with the use of liquid crystals", W. J. Cassarly et al., Optics Letters, vol. 17, No. 8, Apr. 15, 1992, New York, pp. 607–609.
"Diode-pumped upconversion laser with 100-mW output power", R. R. Stephens et al., Optics Letters, vol. 18, No. 1, Jan. 1993, New York, pp. 34–36.
T. Herbert et al., "Diode-Laser-Pumped 551-nm Upconversion Laser in YLiF₄; Er³⁺", OSA Proceedings on Advanced Solid-State Lasers, Optical Society of America, Utah, vol. 6, Mar. 5–7, 1990, pp. 379–383.

Primary Examiner—Léon Scott, Jr.
Attorney, Agent, or Firm—Vijayalakshmi D. Duraiswamy; Wanda K. Denson-Low

[57] ABSTRACT

A spectral narrowing of the output bandwidth from a laser array is obtained by feeding back to the array a portion of its emitted light, while outputting the remainder of the light emitted from the array. An optical system to accomplish this preferably includes a pair of lenses, together with a diffraction grating that can be positioned either in-line with the laser array and lenses, or in a side-arm along with one of the lenses. The lenses can be set up so that light from each laser element is fed back either to itself, or to a symmetrically located element on the opposite side of the system axis. For a multi-lobe output from the laser array, one of the lobes is used for feedback and the others as outputs, resulting in a narrowing of the output angular divergence as well as of the output bandwidth.

35 Claims, 7 Drawing Sheets

U.S. Patent        Jan. 31, 1995        Sheet 1 of 7        5,386,426
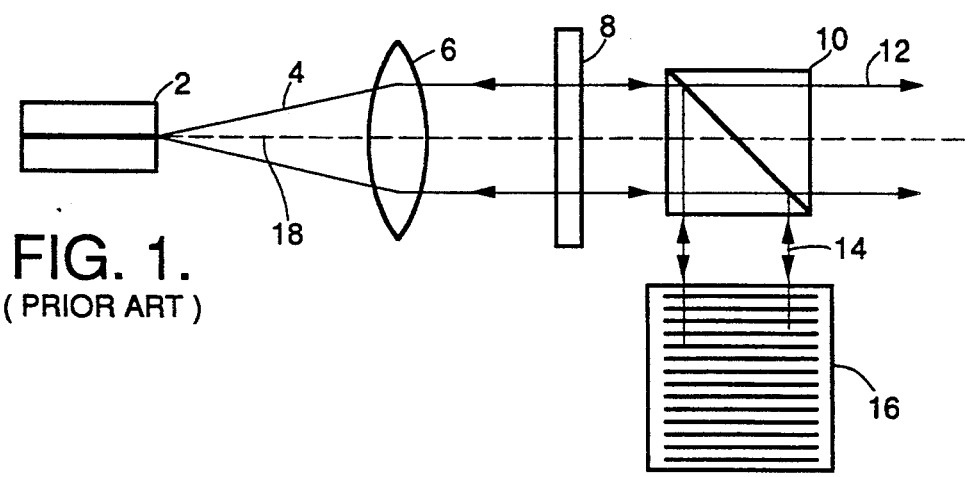
FIG. 1.
(PRIOR ART)
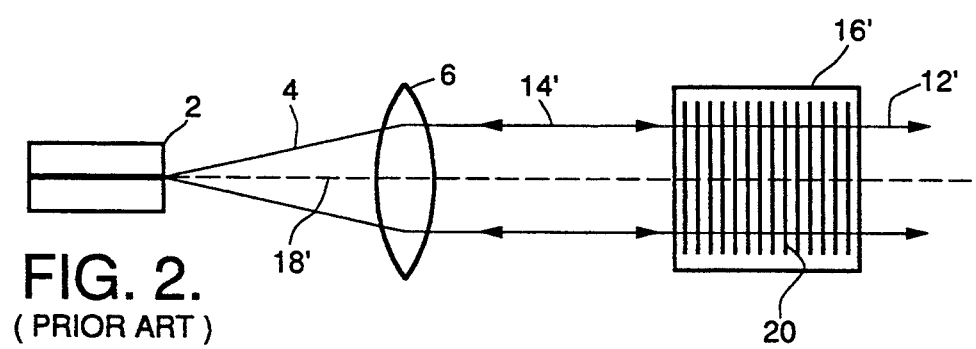
FIG. 2.
(PRIOR ART)
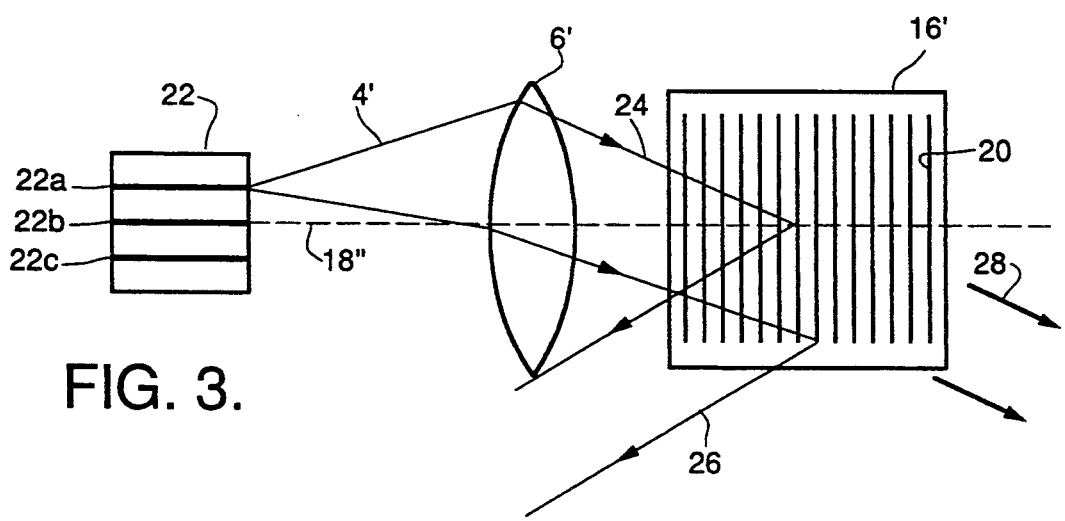
FIG. 3.
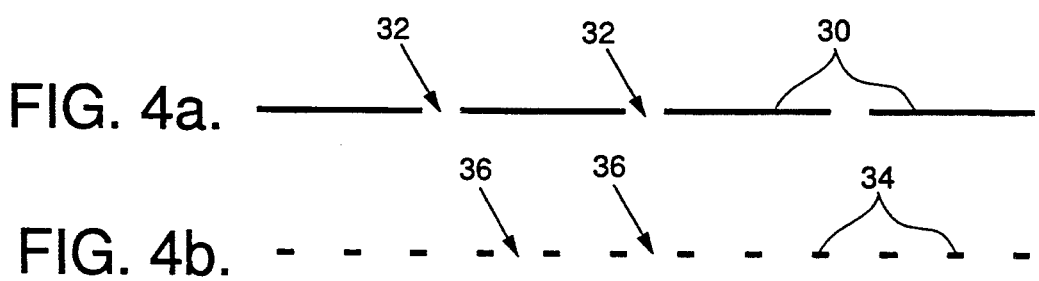
FIG. 4a.
FIG. 4b.

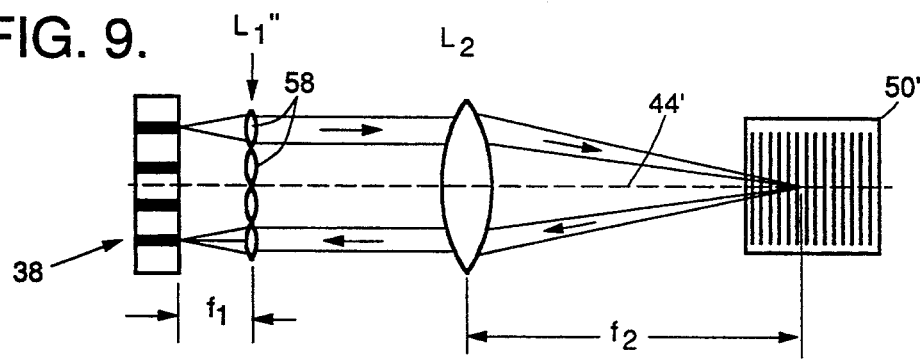
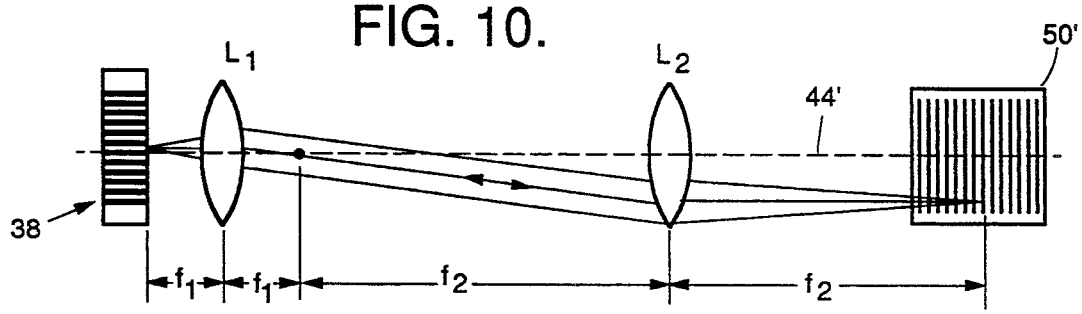
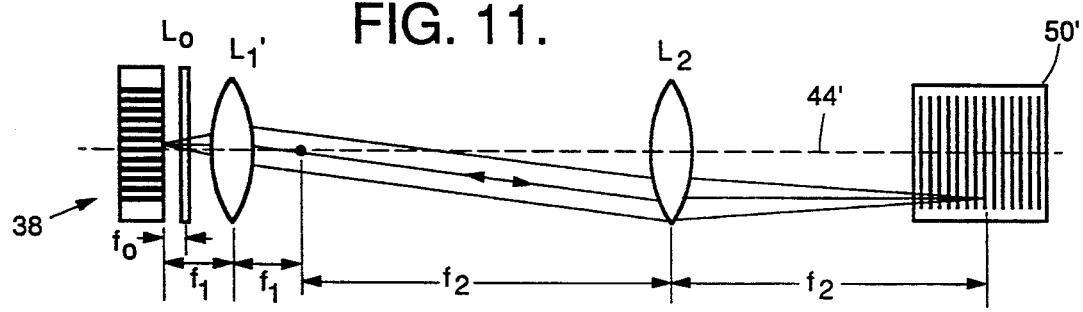
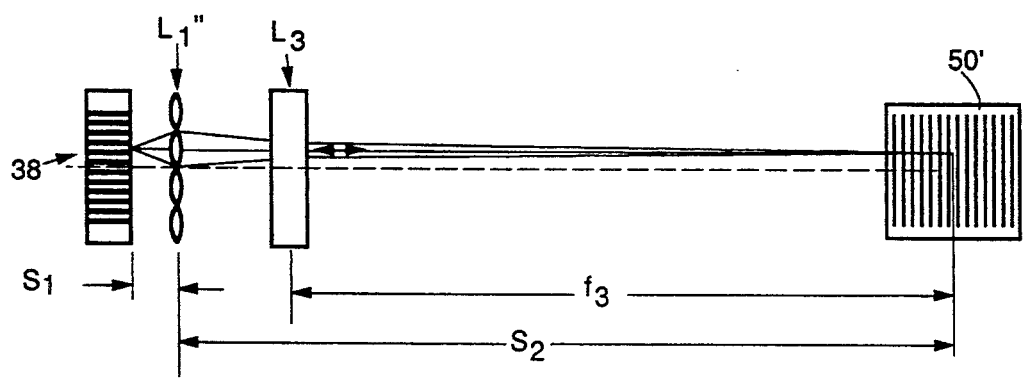

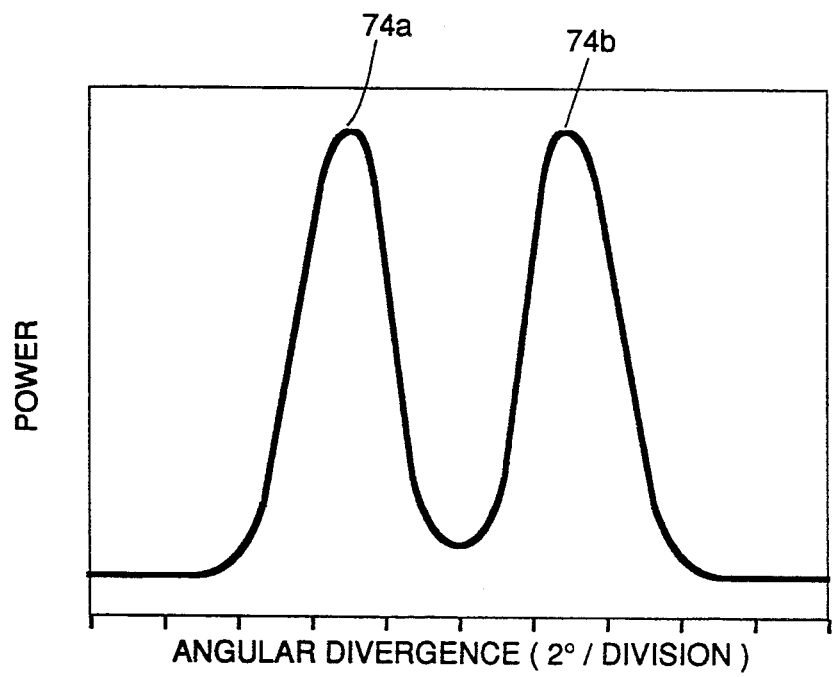
FIG.18.
FIG.19.
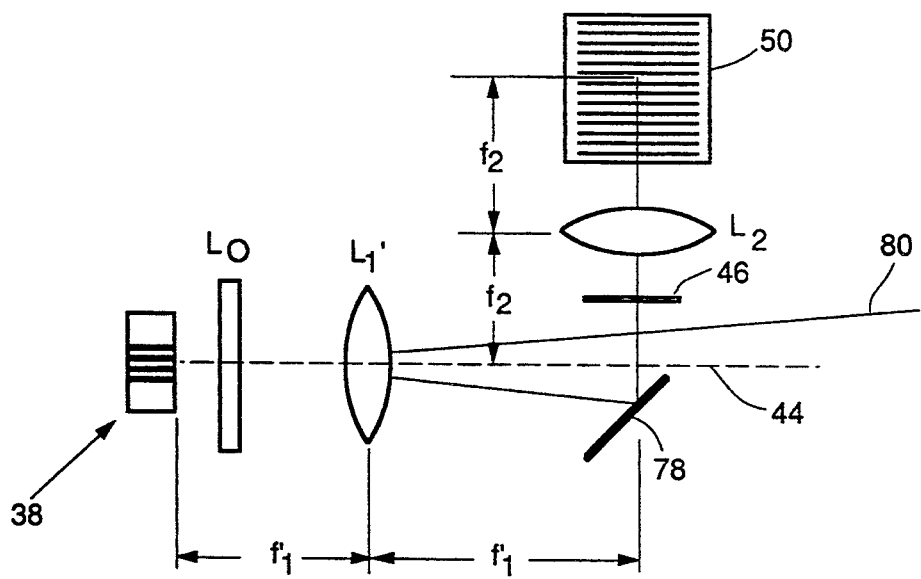

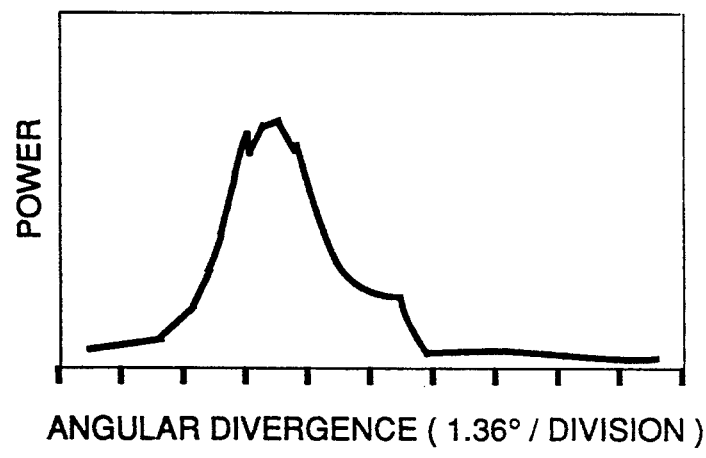
ANGULAR DIVERGENCE ( 1.36° / DIVISION )
FIG. 20.
FIG. 21.
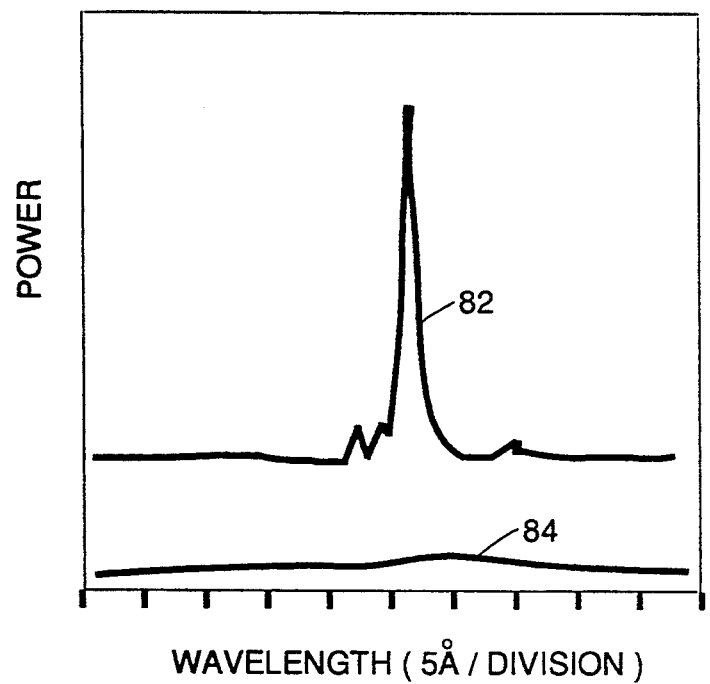
WAVELENGTH ( 5Å / DIVISION )

NARROW BANDWIDTH LASER ARRAY SYSTEM

BACKGROUND OF THE INVENTION

1. Field of the Invention

This invention relates to laser systems in which the output bandwidth is restricted by feeding laser radiation back to the laser source via an optical diffraction grating, and more particularly to the use of this technique for high power laser diode arrays.

2. Description of the Related Art

Diffraction gratings have been used in the past in external cavity laser systems to significantly narrow the output bandwidth from a diode laser, particularly a multiple-stripe quantum well heterostructure diode laser. By reflecting back to the laser a small fraction of its output power, the line width can be significantly reduced. A review of the techniques that have been used to narrow the spectra of diode lasers is provided in Wieman et al., "Using Diode Lasers for Atomic Physics", *Rev. Sci. Instrum.*, Vol. 62, No. 1, January 1991, pages 1–20. The developments covered in this review are restricted to single element, single mode devices that produce very narrow spectral outputs at low power levels.

Applications of the diffraction grating feedback technique to diode lasers have been limited in general to narrow-stripe lasers, with gain channel widths of about 3–6 microns (see Patrick et al., "Frequency Stabilization of a Diode Laser Using Simultaneous Optical Feedback From a Diffraction Grating and a Narrow Band Fabry-Perot Cavity", *Rev. Sci. Instrum.*, Vol. 62, No. 11, November 1991, pages 2593–2595), or at most to multiple stripe, optically coupled, broad-area lasers with gain channel widths of about 100 microns (see Epler et al., "Super Modes of Multiple-Stripe Quantum-Well Heterostructure Laser Diodes Operated (CW, 300K) in an External-Grating Cavity", *Journal of Applied Physics*, Vol. 57, No. 5, Mar. 1, 1985, pages 1489–1494).

Work in the area has centered upon achieving an extremely narrow emission with a single longitudinal mode, or upon examining detailed mode structure in a research context. Output power has not been a primary concern, and the devices have been limited to tens of mW. For example, in Harvey et al., "External-Cavity Diode Laser Using a Grazing-Incidence Diffraction Grating", *Optics Letters*, Vol. 16, No. 12, Jun. 15, 1991, pages 910–912, a diffraction grating was used to reduce the line width of a GaAlAs diode laser by a factor of more than 1,000 from 40 MHz to less than 10 kHz, while the output power was limited to less than 20 mW; in the Epler article mentioned above a bandwidth narrowing from 5-mode 12 Angstroms to single-mode 0.2 Angstroms was achieved with a diode power output of 170 mW.

Even if output power were a primary goal, single element, broad-area lasers are ultimately limited to powers of about 1 to 2 watts by thermal dissipation. However, there are applications which require significantly greater amounts of power. In particular, optically pumped upconversion lasers require high power, spectrally narrow diode pumps to achieve the high output powers and good electrical-to-optical conversion efficiencies that are necessary for full commercial value. Upconversion lasers are used to convert infrared to visible radiation; a full color upconversion laser that is pumped by a single wavelength infrared laser is described for example in McFarlane, U.S. Pat. No. 5,008,890, assigned to Hughes Aircraft Company, the assignee of the present invention. Arrays of spatially separated (and thus optically isolated) lasers which extend over distances on the order of 1 cm are required to produce beam powers in the 5–20 Watt range that is desirable for pumping an upconversion laser. A diode laser has previously been used to pump an upconversion laser, but only in the context of a single 0.1 Watt narrow-stripe, single mode diode pump laser that achieved an output power of only 2 mW at 551 nm (Hebert et al., "Diode-Laser-Pumped 551 nm Upconversion Laser in $YLiF_4:Er^{3+}$", *Proceedings of Advanced Solid State Laser Conference Six*, Optical Society of America, Washington, D.C., 1990, pages 379–383).

The techniques that have previously been used to narrow the emission spectra of single diode lasers are not directly applicable to a much higher power laser array. This is illustrated in FIGS. 1–3, in which prior single-diode narrow bandwidth systems are shown in FIGS. 1 and 2, with FIG. 3 illustrating the consequences of using the same systems in a laser array environment. In FIG. 1 a laser diode 2 is shown emitting a diverging output light beam 4 that is collimated by a spherical lens 6 (the term "light" herein refers to optical emissions in general, and is not limited to visible light). The collimated beam, which is emitted from the laser 2 in a polarized state, is transmitted through a half wave plate 8 to a polarizing beam splitter 10 that divides the beam into an output component 12 that is transmitted through the beam splitter, and a feedback element 14 that is reflected by the beam splitter to a diffraction grating 16. The angular orientation of half wave plate 8 determines the ratio between the output and feedback beam components 12 and 14, respectively. The feedback component 14, which normally represents a minority of the beam power, is retro-reflected from the diffraction grating 16 in the usual manner, returned to polarizing beam splitter 10, and reflected therefrom back through half wave plate 8 and lens 6, which focuses it into the laser 2. This feedback of a portion of the laser output has been found to produce a distinct narrowing of the laser's emission spectrum. It should be noted that the laser beam is symmetrically centered upon a system axis 18, such that the feedback beam component 14 is accurately redirected along a return path back to the laser.

FIG. 2 shows another prior embodiment in which the output of laser 2 is again collimated by lens 6. In this version, however, a diffraction grating 16' is placed directly in the path of the beam that emanates from lens 6. The diffraction grating 16' is partially reflective and partially transmissive, such that the system output is the beam component 12' that is transmitted through the grating; the feedback component 14' is the portion that is reflected back along the system axis 18', through the lens 6 and into the laser 2. The division of the original laser beam into the output and feedback components is controlled by an appropriate selection of the depths and shapes of the grooves (also called rulings) 20 in the diffraction grating 16', in a known fashion. As in FIG. 1, the beam symmetry about the system axis 18' assures a return of the feedback component to the source laser.

The situation changes if a multiple laser array is substituted for the single laser 2 for the purpose of achieving higher beam powers. This situation is illustrated in FIG. 3 for a system that corresponds to that shown in FIG. 2; a similar response is produced if a multiple Laser array is substituted into the system of FIG. 1. The laser array 22 is shown as a lateral array of spatially separated lasers 22a, 22b and 22c that are fabricated in a conventional manner and optically isolated from each other. Although only three lasers are shown, a greater number would normally be required to achieve the high powers necessary for satisfactory upconversion laser pumping. The lasers in FIG. 3 are viewed from above, with the plane of the lasers parallel to the laser plane. For purposes of further discussion, the term "vertical" refers to a direction perpendicular to the plane of the laser diode junctions, while the term "horizontal" refers to a direction parallel to the laser plane.

A system axis 18" is shown extending from the central laser 22b through the center of a spherical lens 6' (shown larger than lens 6 in FIGS. 1 and 2 to accommodate the dimension of the laser array 22) and on to the diffraction grating 16' with grooves 20. Considering the uppermost laser 22a, its output beam 4' is approximately collimated by lens 6'. However, since the laser 22a is off the lens axis, the beam is directed by the lens at an angle to its axis, rather than parallel as in FIGS. 1 and 2. The redirected beam 24 strikes the diffraction grating 16' at a non-perpendicular angle to the diffraction grooves 20. The horizontal component of light which strikes the diffraction grating at this angle is reflected off the grating at an equal angle on the opposite side of the system axis 18", resulting in a reflected beam 26 that does not retrace the original beam path and in fact can miss the lens 6' entirely. The beam's transmitted component 28 leaves the system at an angle to the system axis, but this can be handled with a corresponding rearrangement of the elements external to the system. However, the lack of retro-reflection for the reflected beam component 26 prevents that component from returning to its source laser. As a result the desired narrowing of the output bandwidth is not achieved.

SUMMARY OF THE INVENTION

The present invention seeks to provide a laser system that has a narrow output bandwidth, and yet operates with a multiple diode laser array to produce output powers substantially higher than those achieved with single diode laser systems.

To accomplish these goals, the invention employs an array of optically isolated, independent laser elements that have predetermined emission spectra. An optical transmission system is employed that directs at least a portion of the outputs from the lasers onto an optical diffraction grating, with the grating at least partially reflective of radiation within the lasers' emission spectra. The optical transmission system further directs at least a portion of the laser radiation that is reflected from the diffraction grating back onto the laser array so as to substantially reduce the bandwidth of the output radiation emitted from the array.

The optical transmission system preferably consists of a multiple lens system with a first lens that initially directs the outputs from at least some of the lasers along offset paths that do not return to the laser array, and a second lens that redirects the offset paths so that they do return to the laser array after reflection from the diffraction grating. The lenses can be set up so that they either direct the laser outputs back to the same lasers from which they originated, or to lasers other than the ones from which they originated, after reflection from the diffraction grating. In the latter case the lasers are preferably symmetrically arranged on opposite sides of the system axis, and the double lens transmission system returns a portion of the output from the lasers on each side of the axis to the correspondingly located lasers on the opposite side of the axis.

The system can also be designed to reflect a portion of the laser beams back onto the laser array for spectral narrowing, while transmitting a different portion of the beams that have a reduced angular divergence as an output beam without reflection from the grating. Implementations of this approach include a mirror with a central opening in the path of the laser beams, and a reflector for only one lobe of a beam array when the array has a far field output pattern with a multiple lobe power distribution.

Further features and advantages of the invention will be apparent to those skilled in the art from the following detailed description, taken together with the accompanying drawings.

BRIEF DESCRIPTION OF THE DRAWINGS

FIGS. 1 and 2 are block diagrams, described above, of prior systems for narrowing the emission spectra of single laser diodes;

FIG. 3 is a block diagram, described above, illustrating the consequences of applying the system shown in FIG. 2 to a multiple laser array;

FIGS. 4a and 4b are block diagrams illustrating the emitting apertures of two high power diode laser arrays that can be used with the present invention;

FIGS. 7–9 are block diagrams of embodiments in which the outputs from the individual lasers in an array are fed back to lasers on the opposite sides of the system axis for spectral narrowing;

FIGS. 10–12 are block diagrams of embodiments in which a portion of the outputs from a laser array are fed back to the same lasers from which they originated for spectral narrowing;

FIG. 18 is a graph showing a multi-lobe far field profile from a particular laser array;

FIG. 19 is a block diagram of an optical system in which one lobe of the far field profile shown in FIG. 18 is used for spectral narrowing, and the other for a low divergence output beam; and FIGS. 20 and 21 are graphs respectively showing the far field angular dispersion and the composite spectrum of the output beam produced by the system of FIG. 19.

DETAILED DESCRIPTION OF THE INVENTION

Figure 5:
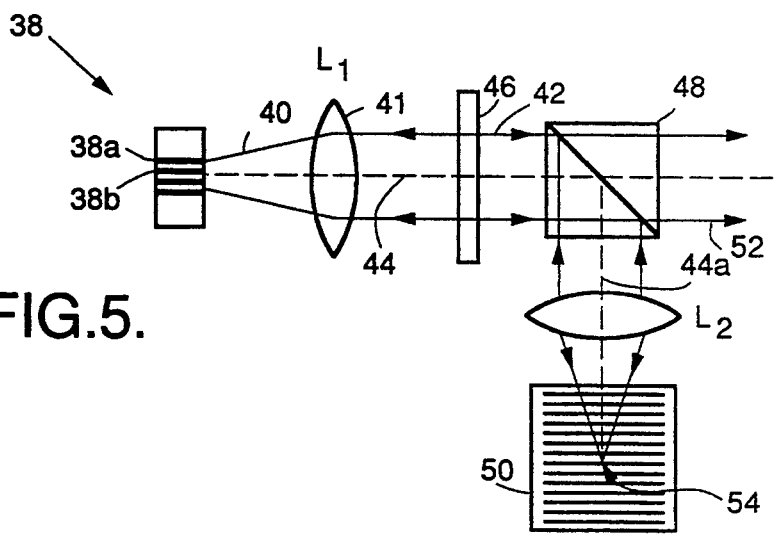
FIG. 5 is block diagram of one embodiment of the invention that employs a reflective diffraction grating in a separate arm of an optical transmission system.

The present invention provides a system that can be implemented in various way to produce a narrow bandwidth, high power laser output suitable for use as a pump beam for upconversion lasers. It employs an array of separate lasers, preferably diode lasers, to achieve an aggregate output with the necessary power. Diode lasers with output powers in excess of about 2 Watts are presently available as arrays of broad-area laser elements. The lasers are separated by passive sections in which no drive current flows, but which allow heat to flow laterally to assist in thermal dissipation. The passive sections also serve to optically isolate the laser elements from each other, such that the array can be considered as an assembly of independent or discrete laser elements extending over a substantial distance.

Examples of two commercially available AlGaAs laser diode arrays that produce light outputs approximately in the 800 nm band are shown respectively in FIGS. 4a and 4b. In FIG. 4a the emitting aperture of a 3 Watt device provided by Spectra Diode Laboratories, Inc. as part number SDL-2482 is shown. It includes four laser elements 30 that are each 120 microns wide and are separated by passive sections 32 that are each 10 microns wide, producing an overall width of approximately 500 microns. In FIG. 4b a 10 Watt array designated SDL-3490-S is illustrated with twelve laser segments 34 that are each 200 microns wide, separated by 600 micron wide passive sections 36, for a total width of approximately 1 cm. Both devices are formed on waveguides approximate 1 micron thick.

One generalized implementation of the invention that allows the use of high power laser arrays such as those illustrated in FIGS. 4a and 4b is shown in FIG. 5. It is somewhat similar in approach to the prior system shown in FIG. 1, but successfully achieves a high power, narrow bandwidth output of which the FIG. 1 system is incapable. It employs an array 38 of optically isolated, independent laser elements 38a, 38b . . . 38n, where n is the total number of laser elements in the array. A first lens $L_1$, illustrated as a spherical lens, approximately collimates the beams 40 from the laser array into beams 42. Although the beams 42 are shown as being generally parallel to the system axis 44 that extends through the centers of the laser array and lens $L_1$, in practice the beams are offset somewhat from the system axis. Several different embodiments of system optics are described below that direct the beams along different overall paths; in general, the first lens $L_1$ directs the beams along offset paths that, if uncorrected, would not result in a proper return of a portion of the beams back to the laser array for spectral narrowing. Since diode lasers typically emit light with an angular vertical divergence on the order of 90° and an angular horizontal divergence on the order of 10°, lens $L_1$ should be large enough to accommodate this divergence, and positioned a focal length away from the laser array to produce the desired collimation.

The beam proceeds from lens $L_1$ through a half wave plate 46 to a polarizing beam splitter 48, which reflects one portion of the beam towards an optical diffraction grating 50 and transmits the remaining portion of the beam 52 as a system output. The half wave plate 46 and polarizing beam splitter 48 function jointly as a variable beam splitter; the half wave plate 46 rotates the beam polarization of the laser array, and the degree of rotation determines the beam proportions that are transmitted and reflected by the polarizing beam splitter 48. The beam component that is polarized along one axis is transmitted as the system output, while the beam component that is polarized along a second axis orthogonal to the first axis is redirected to the diffraction grating 50.

A second lens $L_2$, which is preferably a cylindrical lens that focuses light in the horizontal plane only, is inserted in the path of the reflected beam between the polarizing beam splitter 48 and the diffraction grating 50. The lens $L_2$ redirects the beams that are reflected from the beam splitter onto new paths that intersect the diffraction grating 50 and return back through $L_2$ and $L_1$ to the laser array. This can be done by focusing the reflected beams onto a common area 54 of the diffraction grating, as illustrated in the figure. Since its plane of incidence is parallel to the grating rulings, the light that reaches the diffraction grating is not retro-reflected, but rather is reflected back along a symmetrical path on the opposite side of the system axis.

After recollimation by the second lens $L_2$, the beams returning from the diffraction grating 50 are again reflected by the polarizing beam splitter 48 back through the half wave plate 46 and lens $L_1$, which focuses them onto the laser array 38. However, since the reflected beams are now on the opposite sides of the system axis from which they originated, they are not reflected back to their individual source lasers. Instead, each beam is reflected onto the laser that is located symmetrically on the opposite side of the system axis. For example, the reflected portion of the beam that originated from laser element 38a is fed back to element 38n, the reflected portion of the beam from element 38b is fed back to element 38n-1, etc. Even though the feedback path is from each laser to a different laser, rather than back to the originating laser, a narrowing of the output bandwidth comparable to that achieved with prior broad-area single-laser systems has been found to result.

Instead of focusing the beams onto the common grating area 54, the beams from each of the laser elements could be directed by lenses $L_1$ and $L_2$ onto discrete spots on the opposite side of the side-arm axis 44a from the originating lasers. In this case the beams would strike the grating parallel to the system side-arm axis 44a, and would be reflected back to the originating lasers. Such a system is described below in connection with FIG. 9, but with an inline geometry.

The half wave plate 46 and polarizing beam splitter 48 are adjusted to couple a small fraction of the light from laser array 38, preferably about 20%, onto the diffraction grating 50. The grating would typically be blazed in first order and mounted in the first order Littrow arrangement, so that the vertically dispersed light is reflected directly back toward the laser array. With an appropriate arrangement of the lenses $L_1$ and $L_2$, light that is reflected back from the grating will form an image of the laser array back upon itself. Because of the vertical dispersion, only a narrow bandwidth of the original emission is coupled back into the 1 micron high laser waveguides. If the feedback from the grating is large enough, it extinguishes the free-running (zero grating feedback) laser modes, and all elements of the array emit in substantially the same narrow bandwidth.

The bandwidth B of the emission that is coupled back into the array obeys the approximate formula: $B = HD\cos(G)/f_1 M$, where H is the half-height of the laser waveguide, D is the ruling or groove spacing of the grating, G is the angle between the grating normal and the incident/reflected light, $f_1$ is the focal length of $L_1$, and M is the grating order. The bandwidth is increased by misalignment of the optics and imperfections in the optical components, since these conditions tend to displace and blur the retro-reflected image of the emitting laser array facet. The first lens $L_1$ should have very good diffraction-limited optics, since this lens is used at full aperture and is primarily responsible for forming the 1 micron feature size in the retro-reflected image.

The bandwidth will also be broadened in the case of incomplete suppression of the free-running laser modes, which obtain a sustaining feedback by reflections from the output facet of the laser array. Ideally, the output facet should be anti-reflection coated and the system run as an external cavity laser in which the grating 50 functions as one of the resonator mirrors. However, presently available high power diode arrays have very large gains, and accordingly the facet coating for maximum output is usually about 5%–10% reflecting. For reflectivities this low, a great deal of feedback is not required to overpower the free-running modes, and available laser arrays with no special coatings have been found to work quite well with only small amounts of feedback. In this case the system functions as a self-injection seeded diode laser array.

To obtain an estimate of the required feedback power, a set of injection seeded experiments were conducted on anti-reflection coated and standard (5%–10% reflecting, coated lasers. It was found that suppression of the free-running modes occurred if only 1%–2% of the array's rated output was coupled in from the external master laser; the results were essentially independent of the facet coating.

Instead of the polarizing beam splitter 48 and half wave plate 46, the partially reflective beam splitter could be used. In this case a half wave plate would be added in the side-arm to rotate the beam polarization for maximum reflectivity from the grating.

Figure 6:
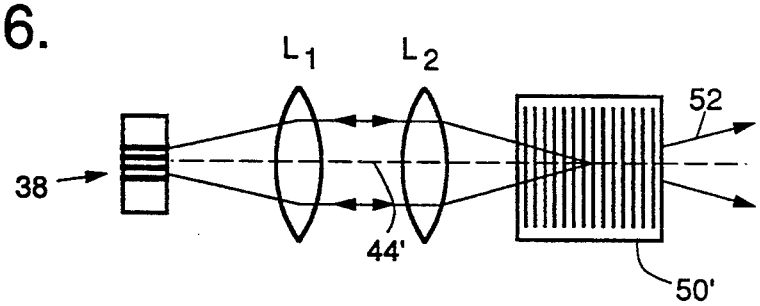
FIG. 6 is a block diagram of an alternate embodiment of the invention that uses an in-line, partially reflective/partially transmissive diffraction grating.

Another possible generalized arrangement for the narrow bandwidth laser diode array system is shown in FIG. 6. In this case a grating 50' that is partially reflective and partially transmissive is mounted in-line with the output beam, and no half wave plate or polarizing beam splitter is required. The output beam 52 is transmitted directly through the grating 50', which results in a more compact system, but as a detriment the full power of the laser array is incident upon the grating. Another potential limitation is that, if aperturing is required to improve the image quality at the laser array, it must be done in the full power beam and will accordingly produce losses. As with the side-arm geometry of FIG. 5 two lenses $L_1$ and $L_2$ are used with the in-line approach of FIG. 6.

Several different optical configurations can be used to effectively interface the diffraction grating with the laser array for both the side-arm geometry of FIG. 5 and the in-line geometry of FIG. 6. The particular one that is used will depend upon the size of the array, whether feedback to the same laser elements from which the beams originated or to laser elements on the opposite side of the system axis is desired, the affordability of the required optics, and the overall system size requirements. In the following examples an in-line grating arrangement along the lines of FIG. 6 is assumed, although the examples are equally applicable to the side-arm geometry of FIG. 5; the in-line and side-arm geometries are equivalent for this purpose. FIGS. 7–10 illustrate "symmetrical" feedback systems in which light from laser elements on one side of the system axis 44' is fed back to symmetrically located laser elements on the opposite side of the system axis. This type of feedback may be important for large devices in which there can be gradients in the AlGaAs stoichiometry which produce laser wavelength shifts along the array. The exchange of light between the opposite halves of the array is projected to make it easier to lock the entire array to the feedback wavelength.

Figure 7:
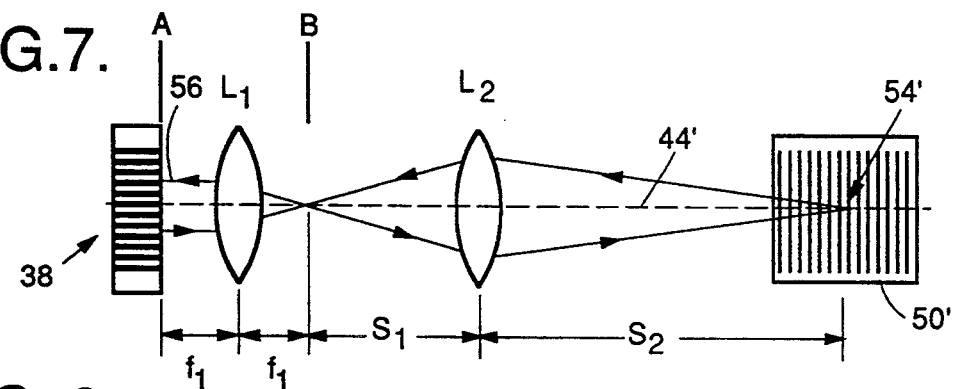

In FIG. 7 the emitting ends of the laser elements 38 are shown arranged along a plane A at the back focal length $f_1$ of the first lens $L_1$, while the front focal plane B of $L_1$ is located between $L_1$ and $L_2$. The spherical lens $L_1$ thus Fourier transforms the light emitted at plane A and displays it at plane B; the light at plane B is the far-field intensity distribution of the array. The cylindrical lens $L_2$ is located a distance S1 in front of plane B, and horizontally focuses the light from each of the laser elements onto a common area 54' at a distance S2 on the grating 50'. The common area 54' illuminated on the grating 50' corresponds to an image of the array far-field initially produced at plane B, thus S1 and S2 are given by the conventional image formula $1/S1 + 1/S2 = 1/f_1$. (Although only the central ray 56 of the light emitted from a particular laser element is shown in FIG. 7, it should be understood that the optical system will operate upon the light emitted from the laser over its full angle of dispersion in an analogous fashion.) A portion of the central ray 56 reflects off the diffraction grating 50' at an angle and retraverses $L_2$. The far-field pattern is thus re-imaged again at plane B, then Fourier transformed by $L_1$ back into the near-field at plane A. Because of the non-normal incidence of the light at the grating, it is coupled back into the laser element that is symmetrically located on the opposite side of the axis 44'. The vertical extent of the far-field pattern is large, due to the large divergence angle in the vertical direction which illuminates the full vertical aperture of collimating lens $L_1$. The beam remains collimated vertically after passing through $L_2$ and thus a large number of grating rulings are illuminated and good resolution is achieved. The system output (not shown) is the major portion of the beam that is transmitted through the grating.

Figure 8:
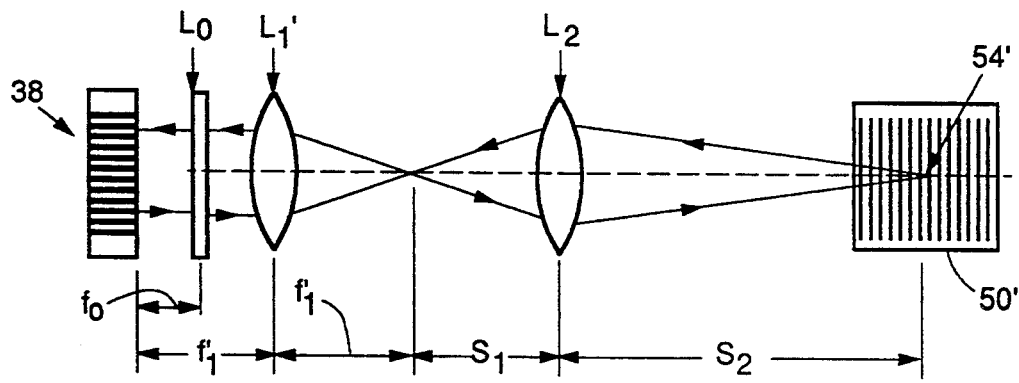

Lens $L_1$ must be a low F number, diffraction-limited lens to produce a good retro-reflected image, and must be well-corrected over the full width of the array. Spherical lenses of this type will typically have a diameter 10–20 times the field of correction. For a 1 cm array, a spherical lens $L_1$ would thus have a diameter of about 10–20 cm, which is extremely large for practical systems. It would also be quite heavy and expensive. The use of two cylindrical lenses is a more viable approach for large arrays. In FIG. 8 the first lens $L_1$ of FIG. 7 is replaced by two cylindrical lenses $L_0$ and $L_1'$. Lens $L_0$ is used to collimate the light vertically; since the optical divergence from the laser elements in the vertical direction is typically about 90°, this lens should have a low F number of 1 or less. Lens $L_1$ performs an approximate horizontal collimation, and accordingly has a significantly higher F number, typically about 2–3. Only lens $L_0$ need be of very good quality to form the vertical 1 micron features, and need be only about 1 cm long to function with the highest power arrays. The remainder of the system operates in a manner similar to that of FIG. 7.

In FIG. 9 a spherical microlens array $L_1''$ is substituted for the spherical lens $L_1$ in FIG. 7, with a separate microlens 58 positioned a focal length in front of each laser element to approximately collimate the light from each element. The cylindrical lens $L_2$ focuses the light horizontally onto the diffraction grating 50' where, due to its non-normal incidence, a portion of the light is reflected back through the system into a laser element located symmetrically across the system axis 44'. In the vertical direction the light at the grating will have a size comparable to the diameter of one of the microlenses. If a large size is required for good spectral resolution, a cylindrical lens beam expander (not shown) may be employed to enlarge the beams.

In the embodiments shown in FIGS. 10-12, light from each laser element is fed directly back into the same laser element from which it originated, rather than to an element on the opposite side of the axis. Referring first to FIG. 10, light from only a single laser element is shown for clarity. The spherical lens $L_1$ collimates the emitted light vertically and approximately collimates the light from each laser horizontally. The horizontal angle which the beam from each laser element makes with the system's optical axis 44' increases with the distance of the laser element from the axis. The second cylindrical lens $L_2$ is located a distance $f1+f2$ from $L_1$, where $f1$ and $f2$ are the respective focal lengths of $L_1$ and $L_2$. Thus, lens $L_2$ is located confocally from $L_1$ and images the array horizontally onto the grating, which is located a distance $f2$ beyond lens $L_2$. The beam from each laser element crosses the system axis at a distance $f1$ from lens $L_1$.

This confocal arrangement of the lenses ensures that the center ray of the light cone from each laser element strikes the grating perpendicularly (in a horizontal direction) along an axis that is generally parallel to the system axis 44', and that the grating acts as a cat's eye retro-reflector. Light from each laser element exactly retraces its path back through the system, and is recoupled into the laser from which it originated. If lenses $L_1$ and $L_2$ are not located a distance $f1$ and $f2$ apart, the array image would not occur at a distance $f2$ behind lens $L_2$, and the grating would not function as a cat's eye retro-reflector. Departures from this ideal spacing result in a lateral displacement of the reflected beam, which would at least partially miss the active gain region of its respective laser element.

In the vertical direction the beam has a height that is roughly equal to the diameter of lens $L_1$, so that many rulings of the grating are illuminated and good feedback spectral resolution is obtained. Lens $L_2$ should ideally have its axis tilted to match that of the grating surface so that a well defined image is formed on the grating surface, thus ensuring that the distance between lens $L_2$ and the grating is the same for all vertical distances. This in turn yields the best image quality vertically of the retro-reflected light at the laser facet.

In FIG. 11 a low F number cylindrical lens $L_0$ is used to collimate the light vertically, and a much higher F number cylindrical lens $L_1'$ performs the approximate horizontal collimation. The criteria for these lenses is similar to that discussed in connection with FIG. 8. Except for the substitution of the two cylindrical lenses $L_0$ and $L_1'$ for the single spherical lens $L_1$, the operation of the system shown in FIG. 11 is essentially the same as that in FIG. 10.

In the variation shown in FIG. 12, an array of spherical microlenses $L_1''$ is used to image each laser element onto the grating 50'. The imaging is performed at the distance $S_2$, as defined above. The central ray of the light cone from each laser element is incident perpendicular to the grating in the horizontal direction, and the light thus reflects directly back into the laser element from which it originated. A diverging cylindrical lens $L_3$ is located at a distance of one focal length $f3$ from the grating, and vertically collimates the light to an area that is large enough to illuminate sufficient grating rulings for good resolution. A beam expander/collimator could also be used to achieve an even larger vertical spot size on the grating.

Experiments were conducted with a system like FIG. 10, but implemented with the side-arm geometry of FIG. 5. A 3 Watt SDL-2482 laser array was used along with a Special Optics, Inc. No. 54-18-15-800 four element, spherical, F/0.83 lens with a 15 mm focal length, 18 mm diameter, and fully corrected over a field of 1 mm for the first lens $L_1$, and a 20 cm focal length plano-convex cylindrical lens for the second lens $L_2$. A holographic diffraction grating with 1,800 lines/mm, and a reflectivity at the operating 797 mm wavelength of approximately 62%, was used for the experiment.

Figure 13:
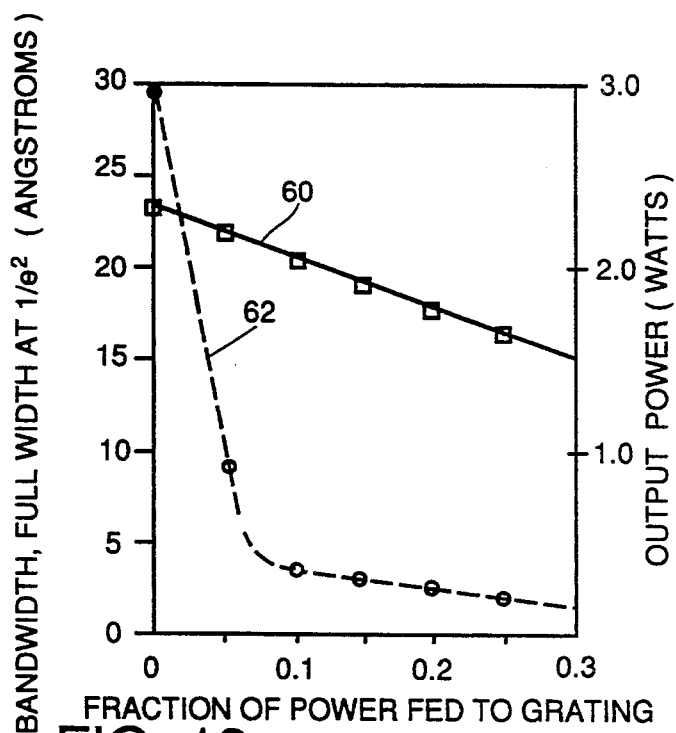
FIGS. 13–15 are graphs of experimental results achieved with the system like FIG. 10 but implemented with the side-arm geometry of FIG. 5.

The system's output power and bandwidth are plotted in FIG. 13 as a function of the portion of the original beam power diverted to the diffraction grating 50. The output power and bandwidth are indicated by curves 60 and 62, respectively. With no power diverted to the diffraction grating, the laser array exhibited an output of 2.3 Watts and a bandwidth of about 30 Angstroms. The bandwidth rapidly narrowed as the feedback was increased, reaching 3.2 and 1.9 Angstroms with 10% and 25% of the power diverted towards the diffraction grating, respectively. Thus, the bandwidth was reduced by a factor of about 15 with a loss in output power of only about 20%-25%.

Figure 14:
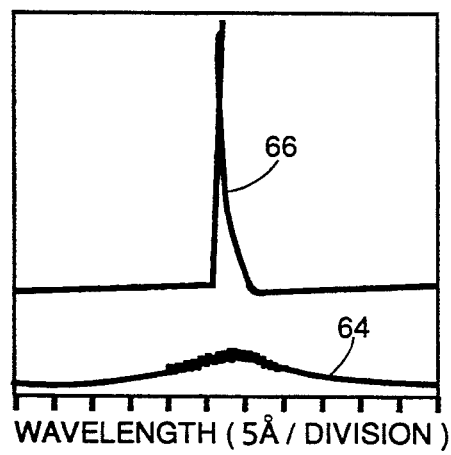

FIG. 14 shows details of the spectral output achieved with 20% of the power diverted towards the grating. With the grating blocked to prevent any feedback, an emission bandwidth of 30 Angstroms resulted, as indicated by curve 64. With the feedback added, the aggregate spectrum from all of the laser elements in the array had a full width bandwidth of 2.2 Angstroms at the $1/e^2$ intensity points, where e is the logarithmic base 2.71828, as indicated by curve 66. The power under these conditions was 1.8 watts. Since the resolution of the monochrometer system used for the measurement was about 0.9 Angstrom, the actual emission bandwidth was actually somewhat less than that indicated by curve 62.

Figure 15:
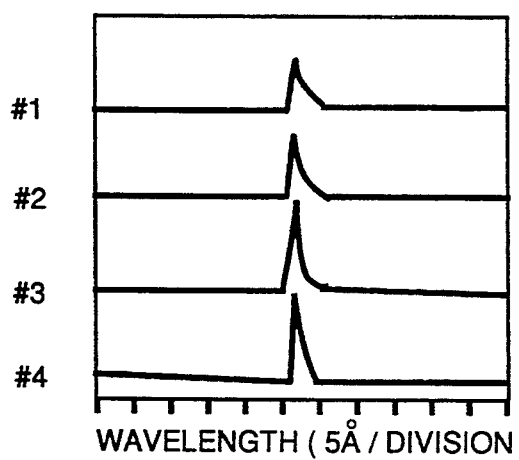

FIG. 15 shows the output spectra from each of the four laser elements in the array in the presence of feedback from the diffraction grating. These spectral curves demonstrate that each of the laser elements were emitting in substantially the same bandwidth.

The system described above was used to optically pump an Er:YLiF$_4$ upconversion laser, which produced an output of 100 mW at 551 nm. Under these conditions, 88% of the array power was absorbed in a 5 mm long crystal at the pump absorption wavelength of 797 nm, which had a nominal bandwidth of 1 Angstrom. The performance of the upconversion laser demonstrated the utility of the laser array system.

Figure 16:
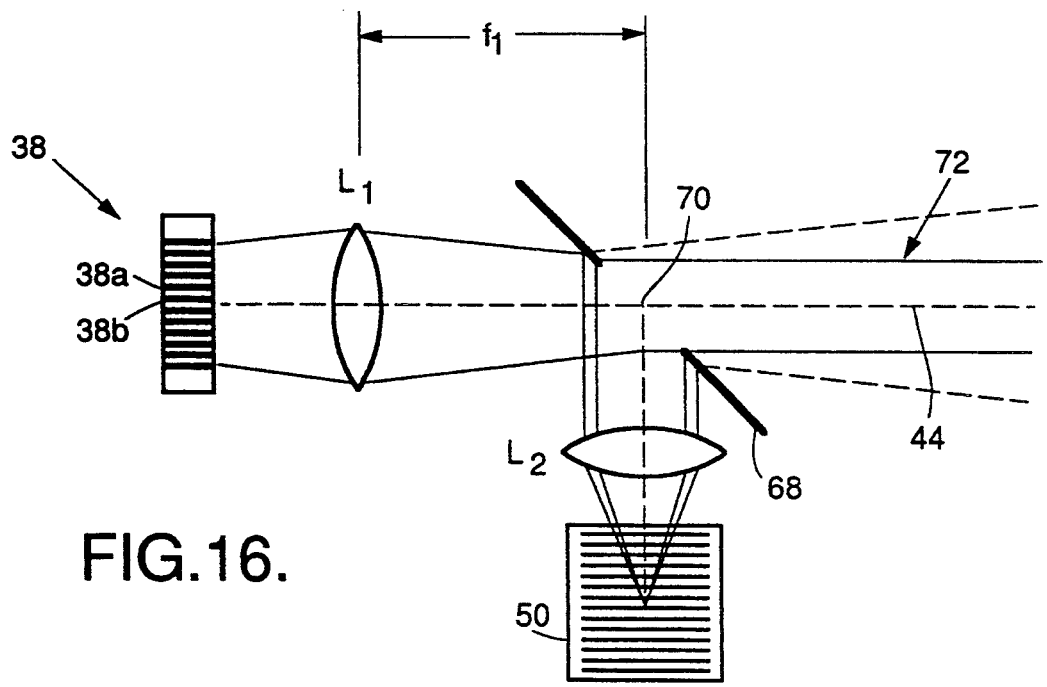
FIG. 16 is a block diagram of another embodiment in which one portion of the output from a laser array is fed back to the array for spectral narrowing, with a less angularly divergent portion transmitted as an output from the system.

Another system is shown in FIG. 16 that not only narrows the output spectrum as with the previous embodiments, but also produces an output beam that has a smaller divergence than the free-running laser array. In this approach, portions of the beam which have a higher angular divergence are used to provide a spectral narrowing for the portions of the beam that have a smaller angular divergence. The high divergence light is exclusively coupled to the diffraction grating, while the low divergence light is passed out of the system as an output.

Figure 17:
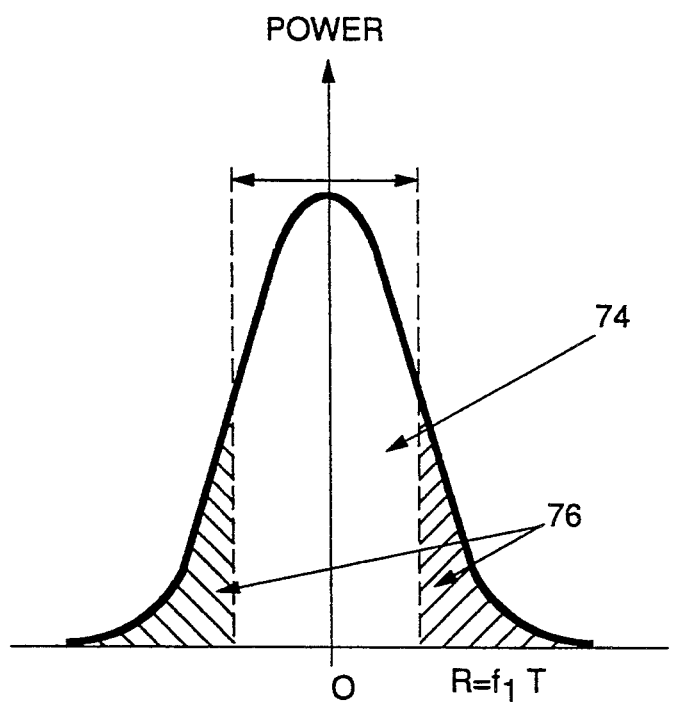
FIG. 17 is a graph that illustrates the power division between the feedback and output portions of the beam in the system of FIG. 16.

The embodiment of FIG. 16 employs a side-arm geometry analogous to that of FIG. 5. However, instead of a polarizing beam splitter and half wave plate, a mirror 68 with a central opening 70 is used to direct the outer portion of the laser array beams to the grating 50, and to pass the center portion of the beams as an output 72. The mirror 68 is located at the back focal plane of lens $L_1$, where The Fourier transform of the laser array output facet (the far-field pattern) is formed. Light that is emitted from the laser array at an angle T is mapped into the mirror plane according to the relation R=f1T, where R is the distance from the optical axis 44, f1 is the focal length of lens $L_1$ and T is in radians. The mirror 68 thus acts as a spatial filter, collecting the larger angular divergence components of the beam through lens $L_2$ to the grating, and passing the lower divergence components as the system output. This is illustrated in the graph of FIG. 17, in which the central portion of the beam that provides the system output is indicated by the unshaded area 74, while the outer portion of the beam that is used for feedback to narrow the output bandwidth is indicated by the shaded area 76. The high divergence components that are fed back into the laser array 38 spectrally narrow not only the high divergence laser modes, but also the lower divergence modes due to the strong mode mixing that is present within the individual laser elements.

A trade-off is made with this approach between angular divergence, spectral narrowing and output power. As the opening in the mirror is made smaller to increase the amount of feedback and thus obtain a narrower spectrum, the angular divergence decreases but the output power also drops. Power is thus traded off for a narrowed spectrum, but a better beam quality is also obtained.

It is not necessary that the mirror symmetrically sample the output of the laser array, and features that are present in the far-field profile of the array may suggest other approaches. For example, present high power laser arrays often incorporate current confinement stripes within each laser element that cause the element to run in a series of transverse modes that are antisymmetric with respect to the stripes. This results in the elements each having a double-lobe far-field pattern, and the array itself will consequently also have a composite double-lobe far field pattern. This phenomenon is illustrated in FIG. 18 for a 10 Watt array with the general structure shown in FIG. 4b. The beam power is plotted as a function of angular divergence from the beam's center line, and exhibits two lobes 74a and 74b on opposite sides of the center line. In accordance with the invention, one of the lobes is used for spectral narrowing feedback, and the other for an output.

A system that can be used to implement this approach is shown in FIG. 19. It employs orthogonal cylindrical lenses $L_0$ and $L_1'$ along the main system axis 44, and a half wave plate 46 together with cylindrical lens $L_2$ in a side-arm to grating 50. A flat mirror 78 is positioned confocally with respect to lenses $L_1'$ and $L_2$ to reflect one of the lobes into the side-arm. The path for the other lobe is unobstructed, allowing it to emerge as the system output 80. Each of the laser elements within laser array 38 contributes to each of the lobes, and the feedback lobe that is retro-reflected by grating 50 is also returned to each of the laser elements. As with FIG. 16, the embodiment of FIG. 19 can be implemented with either an in-line or a side-arm geometry, and the feedback can be to either the originating lasers or symmetrically located lasers.

In a demonstration of the FIG. 19 system, a 10 Watt SDL-3490-S laser array with the free-running far field pattern shown in FIG. 18 was employed. The focal length of lenses $L_1'$ and $L_2$ were respectively 10 cm and 20 cm, while lens $L_0$ was implemented with a serial pair of cylindrical lenses, the first having a focal length of 0.635 cm and the second 2.22 cm. Half wave plate 46 was used to rotate the beam polarization for maximum reflectivity from the grating. The angular power distribution obtained for the output beam 80 is shown in FIG. 20. It had a full width at $1/e^2$ of 5.5°, with a power of 5.75 Watts. This can be compared to the free-running case for the same laser array, which had a width of 10.9° and a power of 9.2 Watts. The output divergence was approximately halved, as was the output power. However, a very narrow spectral bandwidth was obtained, as shown in FIG. 21. The upper profile 82 shows the composite spectrum of all 12 laser elements in the array, which had a full width at $1/e^2$ of 2.5 Angstroms. This represented a significant reduction in the approximately 40 Angstrom bandwidth of the free-running array, indicated by the lower profile 84 of FIG. 21.

The invention thus makes possible the achievement of a high power array with a very narrow spectral bandwidth, and also with a narrow angular divergence. While several illustrative embodiments of the invention have been shown and described, numerous variations and alternate embodiments will occur to those skilled in the art. For example, while a diffraction grating is used in the preferred embodiment as the principal reflection element, a prism and mirror combination, an etalon, or a Fabry-Perot interferometer might also be used. Such variations and alternate embodiments are contemplated, and can be made without departing from the spirit and scope of the invention as defined in the appended claims.

I claim:

1. A narrow bandwidth laser array system, comprising:
    an array of optically isolated, independent lasers having predetermined emission spectra,
    a reflection element that is at least partially reflective of radiation within said emission spectra,
    optical transmission means for directing at least a portion of the optical outputs from said lasers onto said reflection element, and for directing a vertically dispersed portion of the laser radiation reflected from said reflection element back onto said laser array wherein the bandwidth of said portion is limited by the height of said lasers so as to substantially reduce the bandwidth of the output radiation from said laser array.

2. The laser array system of claim 1, wherein said reflection element comprises an optical diffraction grating.

3. The laser array system of claim 2, wherein said laser array and diffraction grating are positioned along a system axis with at least some of said lasers offset from said axis, and said optical transmission system comprises a multiple lens system that includes a first lens means constructed and positioned to initially direct the outputs from a set of at least some of said offset lasers along offset paths that do not return to said laser array, and a second lens means constructed and positioned to redirect said offset paths so that said outputs from said set of lasers return to said laser array after reflection from said diffraction grating.

4. The laser array system of claim 3, wherein said second lens means redirects said offset paths so that outputs of said set of offset lasers are returned to the lasers from which they originate after reflection from said diffraction grating.

5. The laser array system of claim 3, wherein said second lens means redirects said offset paths so that outputs of said offset lasers are returned to lasers other than the ones from which they originated after reflection from said diffraction grating.

6. The laser array system of claim 5, wherein said lasers are symmetrically arranged on opposite sides of said system axis, and said second lens means redirects said offset paths so that outputs from said offset lasers on each side of said system axis are returned to corresponding lasers on the opposite side of said system axis after reflection from said diffraction grating.

7. The laser array system of claim 2, wherein said optical transmission system directs an output portion of the optical outputs from said lasers as an output beam without reflection from said diffraction grating and a feedback portion of the optical outputs from said lasers onto said diffraction grating for reflection from the grating back to the lasers that provide said output beam portion.

8. The laser array system of claim 7, wherein said optical transmission system provides said output portion of the optical outputs from said lasers with a substantially lower angular divergence than the overall optical outputs from said lasers.

9. The laser array system of claim 8, wherein said optical transmission system selects a symmetrical outer portion of the optical outputs from said lasers for said output portion.

10. The laser array system of claim 8, wherein said array of lasers produces a far field output pattern with a multiple lobe power distribution, and said optical transmission system selects one of said lobes for said output portion, and the other of said lobes for said feedback portion.

11. A narrow bandwidth laser array system, comprising:
an array of optically isolated independent lasers having predetermined emission spectra,
an optical reflection element that is reflective of radiation within said emission spectra,
a beam splitter for transmitting as an output beam a portion of the light from said lasers and for redirecting to said reflection element other light from said lasers, and for reflecting back to said lasers from said reflection element a vertically dispersed portion wherein the bandwidth of said portion is limited by the height of said lasers so as to substantially reduce the bandwidth of the output radiation emitted from said laser array,
a first lens means for collimating light from said lasers for redirection by said beam splitter onto said reflection element, and
a second lens means for focusing light from said lasers that is redirected by said beam splitter onto said reflection element, and for collimating light reflected from said reflection element onto said beam splitter.

12. The laser array system of claim 11, wherein said reflection element comprises a diffraction grating.

13. The laser array system of claim 12, wherein said lasers are arranged on opposite sides of a system axis, and said beam splitter and diffraction grating are arranged to reflect light so that outputs from the lasers on each side of said system axis are returned to lasers on the opposite side of said system axis.

14. The laser array system of claim 11, wherein said beam splitter comprises a polarizing beam splitter, and means are provided for controlling the polarization of the light transmitted from said lasers to the polarizing beam splitter, said polarizing beam splitter transmitting at an output beam light from said lasers that is polarized along a first axis, and redirecting to said reflection element light from said laser element that is polarized along a second axis orthogonal to said first axis.

15. The laser array system of claim 14, said polarization controlling means comprising a rotatable half-wave-plate for controlling the division of light from said lasers between said first and second polarization axes.

16. The laser array system of claim 11, wherein said lasers are arranged on opposite sides of a system axis, and said first and second lens means and reflection element are arranged to return light that is emitted from the lasers on each side of said system axis and reflected from said diffraction grating back to the lasers from which they originated.

17. A narrow bandwidth laser array system, comprising:
an array of optically isolated, independent lasers having predetermined emission spectra,
an optical reflection element That is partially transmissive and partially reflective of radiation within said emission spectra, and
first and second lens means for directing light emitted from said lasers onto said reflection element and for directing a vertically dispersed portion of the light reflected back from said reflection element along a return path to said lasers, wherein the bandwidth of said portion is limited by the height of said lasers, so as to substantially reduce the bandwidth of the output radiation emitted by said laser array, the light transmitted by said reflection element providing an output from said system.

18. The laser array system of claim 17, wherein said reflection element comprises a diffraction grating.

19. The laser array system of claim 18, wherein said lasers are arranged on opposite sides of a system axis, and said first and second lens means and diffraction grating are arranged to return light that is emitted from the lasers on each side of said system axis and reflected from said diffraction grating back to the lasers on the opposite side of said system axis.

20. The laser array system of claim 19, wherein said first lens means is arranged to collimate light from said lasers along respective axes that are generally parallel to said system axis, and said second lens means is arranged to focus light from each of said lasers that has been collimated by said first lens means onto a common area of said diffraction grating.

21. The laser array system of claim 20, said first lens means comprising an array of microlenses, with a respective microlens for each laser element.

22. The laser array system of claim 19, wherein said first lens means is arranged to focus light from each of said lasers onto a common focal area between said first and second lens means, and said second lens means is arranged to focus light beyond said common focal area onto a common focal area of said diffraction grating.

23. The laser array system of claim 22, said first lens means comprising a pair of mutually orthogonal cylindrical lenses arranged along axes that are respectively generally parallel and generally orthogonal to the rulings of said diffraction grating, with the cylindrical lens whose axis is generally parallel to said rulings having a substantially lower F number than the other cylindrical lens.

24. The laser arrays system of claim 18, wherein said lasers are arranged on opposite sides of a system axis, and said first and second lens means and diffraction grating are arranged to return light that is emitted from the lasers on each side of said system axis and reflected from said diffraction grating back to the laser elements from which they originated.

25. The laser array system of claim 24, wherein said first lens means is arranged to collimate light from said lasers along respective axes that intersect a common location along said system axis between said first and second lens means, and said second lens means is arranged to focus light from said lasers that has been collimated by said first lens means along respective axes that are generally parallel to said system axis to respective locations on said diffraction grating.

26. The laser array system of claim 25, said first and second lens means comprising spherical and cylindrical lenses respectively.

27. The laser array system of claim 25, said second lens means comprising a cylindrical lens, and said first lens means comprising a pair of mutually orthogonal cylindrical lenses arranged along axes that are respectively generally parallel and generally orthogonal to the gratings of said diffraction grating, with the cylindrical lens whose axis is generally parallel to said gratings having a substantially lower F number than the other cylindrical lens.

28. The laser array system of claim 24, wherein said first lens means is arranged to focus light from said laser elements along respective axes that are generally parallel to said system axis to respective locations on said diffraction grating, and said second lens means is arranged to collimate, in a direction generally orthogonal to the rulings of said diffraction grating, light from said laser elements that has been focused by said first lens means.

29. The laser system of claim 28, said first lens means comprising an array of microlenses, with a respective microlens for each laser element.

30. A narrow bandwidth laser array system, comprising:
an array of optically isolated, independent laser elements having predetermined emission spectra,
an optical reflection element that is reflective of radiation within said emission spectra,
a first lens means in the path of the light emitted from said lasers for processing a portion of said light into an output beam,
means for redirecting light from said laser element that has been transmitted through said first lens means but is not included in said output beam, and
a second lens means that is arranged to focus said redirected light onto said reflection element so that it is reflected back to the lasers from which said output beam is obtained to substantially reduce the bandwidth of the output radiation emitted by said laser elements.

31. The laser array system of claim 30, said reflection element comprising a diffraction grating.

32. The laser array systems of claim 31, said light redirecting means comprising a mirror.

33. The laser array of claim 31, said light redirecting means blocking a portion of the light from said laser elements so that said output beam has a substantially lower angular divergence than the overall optical outputs from said lasers.

34. The laser array system of claim 33, said light redirecting means comprising a mirror with an opening to transmit said output beam, said mirror reflecting light from said lasers that is outside said opening onto said second lens means.

35. The laser array system of claim 33, wherein said array of lasers produces a far field pattern with a multiple lobe power distribution, and said light redirecting means is outside the path of one of said lodes which provides said output beam, and redirects the other lobes to said second lens means.

* * * * *